(12) United States Patent
O'Day

(10) Patent No.: US 8,754,719 B1
(45) Date of Patent: Jun. 17, 2014

(54) INTEGRATED CIRCUIT DEVICES USING ANALOG DIVIDERS

(75) Inventor: Justin O'Day, Palos Park, IL (US)

(73) Assignee: Integrated Device Technology Inc., San Jose, CA (US)

( * ) Notice: Subject to any disclaimer, the term of this patent is extended or adjusted under 35 U.S.C. 154(b) by 38 days.

(21) Appl. No.: 13/334,535

(22) Filed: Dec. 22, 2011

(51) Int. Cl.
*H03B 5/08* (2006.01)

(52) U.S. Cl.
USPC ...... 331/167; 331/2; 331/117 R; 331/117 FE; 377/47

(58) Field of Classification Search
USPC ...... 331/74, 111, 167, 117 R, 117 FE, 179, 2; 327/182, 334, 113, 117; 377/47
See application file for complete search history.

(56) References Cited

U.S. PATENT DOCUMENTS

| 4,972,446 A * | 11/1990 | Kennedy et al. ................. 377/47 |
| 7,724,097 B2 * | 5/2010 | Carley et al. .................... 331/74 |
| 2010/0271144 A1 | 10/2010 | McCorquodale et al. |

* cited by examiner

*Primary Examiner* — Arnold Kinkead

(74) *Attorney, Agent, or Firm* — Myers, Bigel, et al.

(57) ABSTRACT

A divider for use in an integrated circuit chip, such as a clock generator chip, includes a ramp generator circuit configured to generate a ramp signal and a synchronous detector circuit configured to receive the ramp signal and an input clock signal and to responsively control the ramp signal generator circuit to generate an output clock signal at an output of the synchronous detector circuit. In some embodiments, the synchronous detector circuit may include a voltage threshold detector circuit configured to receive the ramp signal and to generate a detection signal responsive thereto and a synchronous latch circuit having a clock input configured to receive the input clock signal and a data input configured to receive the detection signal. The synchronous latch circuit may be configured to control the ramp generator circuit.

7 Claims, 8 Drawing Sheets

US 8,754,719 B1

INTEGRATED CIRCUIT DEVICES USING ANALOG DIVIDERS

FIELD

The inventive subject matter relates to integrated circuits and, more particularly, to divider circuits.

BACKGROUND

Divider circuits are commonly used in integrated circuit devices to provide clock signals having a desired frequency. For example, clock generation integrated circuits (ICs) may use divider circuits to generate lower-frequency clock signals from a higher frequency periodic signal generated by a crystal oscillator or a resonant tank oscillator. Such clock generator ICs may be used in a wide variety of computing and telecommunications applications.

In many integrated circuit applications, it may be desirable to provide variable dividers that can be user-programmed to produce signals of various frequencies. It is generally desirable that a variable divider be able to operate from a relatively high frequency input clock signal to allow the divider circuit to provide relatively high output resolution. However, maintaining high resolution while providing a large division factor range may be difficult.

Divider circuits for clock signal generation commonly use chains of synchronous logic circuits (e.g., flip-flops) to divide the input clock signal down to a desired frequency. Such circuitry may consume an undesirable amount of space and power. Generally, the more a high frequency clock is divided by such a circuit, the more power is dissipated.

SUMMARY

In some embodiments of the inventive subject matter, an integrated circuit chip, such as a clock generator integrated circuit chip, includes an oscillator circuit configured to generate a first clock signal and a divider circuit configured to generate a second clock signal responsive to the first clock signal and an analog ramp signal. The divider circuit may include a ramp generator circuit configured to generate the ramp signal and a synchronous detector circuit configured to receive the ramp signal and the first clock signal and to responsively control the ramp signal generator circuit to generate the second clock signal at an output of the synchronous detector circuit. The synchronous detector circuit may include a voltage threshold detector circuit configured to receive the ramp signal and to generate a detection signal responsive thereto and a synchronous latch circuit having a clock input configured to receive the input clock signal and a data input configured to receive the detection signal. The synchronous latch circuit may be configured to control the ramp generator circuit.

In further embodiments, the divider circuit may include a capacitance, a current source circuit configured to supply a charging current to the capacitance, a threshold detector circuit configured to generate a detection signal responsive to a voltage of the capacitance, a flip-flop circuit configured to receive the detection signal at a data input thereof and the first clock signal at a clock input thereof and to responsively generate an output signal, and a discharge circuit configured to discharge the capacitance responsive to the flip-flop circuit. The integrated circuit chip may further include a control circuit configured to adjust the current source circuit and/or the capacitance.

In some embodiments, the oscillator circuit may include an LC oscillator (LCO) circuit configured to generate a periodic signal and a converter circuit configured to generate the first clock signal from the periodic signal.

Some embodiments of the inventive subject matter provide an integrated circuit divider including a ramp generator circuit configured to generate a ramp signal. The divider further includes a synchronous detector circuit configured to receive the ramp signal and an input clock signal and to responsively control the ramp signal generator circuit to generate an output clock signal at an output of the synchronous detector circuit. In some embodiments, the synchronous detector circuit may include a voltage threshold detector circuit configured to receive the ramp signal and to generate a detection signal responsive thereto and a synchronous latch circuit having a clock input configured to receive the input clock signal and a data input configured to receive the detection signal. The synchronous latch circuit may be configured to control the ramp generator circuit.

In some embodiments, the ramp generator circuit may include a current source circuit configured to supply a charging current to a capacitance and a discharge circuit configured to discharge the capacitance responsive to the synchronous latch circuit. The divider may further include a control circuit configured to adjust the current source circuit and/or the capacitance to control a division factor of the divider.

Some embodiments of the inventive subject matter provide an integrated circuit divider including a capacitance and a current source circuit configured to supply a charging current to the capacitance. The divider also includes a threshold detector circuit configured to generate a detection signal responsive to a voltage of the capacitance and a flip-flop circuit configured to receive the detection signal at a data input thereof and a clock signal at a clock input thereof and to responsively generate an output signal. The divider further includes a discharge circuit configured to discharge the capacitance responsive to the flip-flop circuit.

In some embodiments, the threshold detector circuit may include an inverter circuit. The divider may also include a boost circuit coupled to an input of the inverter circuit and configured to boost a voltage at the input of the inverter circuit in response to a state transition of the output of the inverter. The capacitance may include a capacitor and/or an intrinsic capacitance coupled to the input of the threshold detector circuit. The divider may further include a control circuit configured to adjust the current source circuit and/or the capacitance.

BRIEF DESCRIPTION OF THE DRAWINGS

The accompanying drawings, which are included to provide a further understanding of the inventive subject matter and are incorporated in and constitute a part of this application, illustrate certain embodiment(s) of the inventive subject matter. In the drawings.

DETAILED DESCRIPTION

Figure 1:
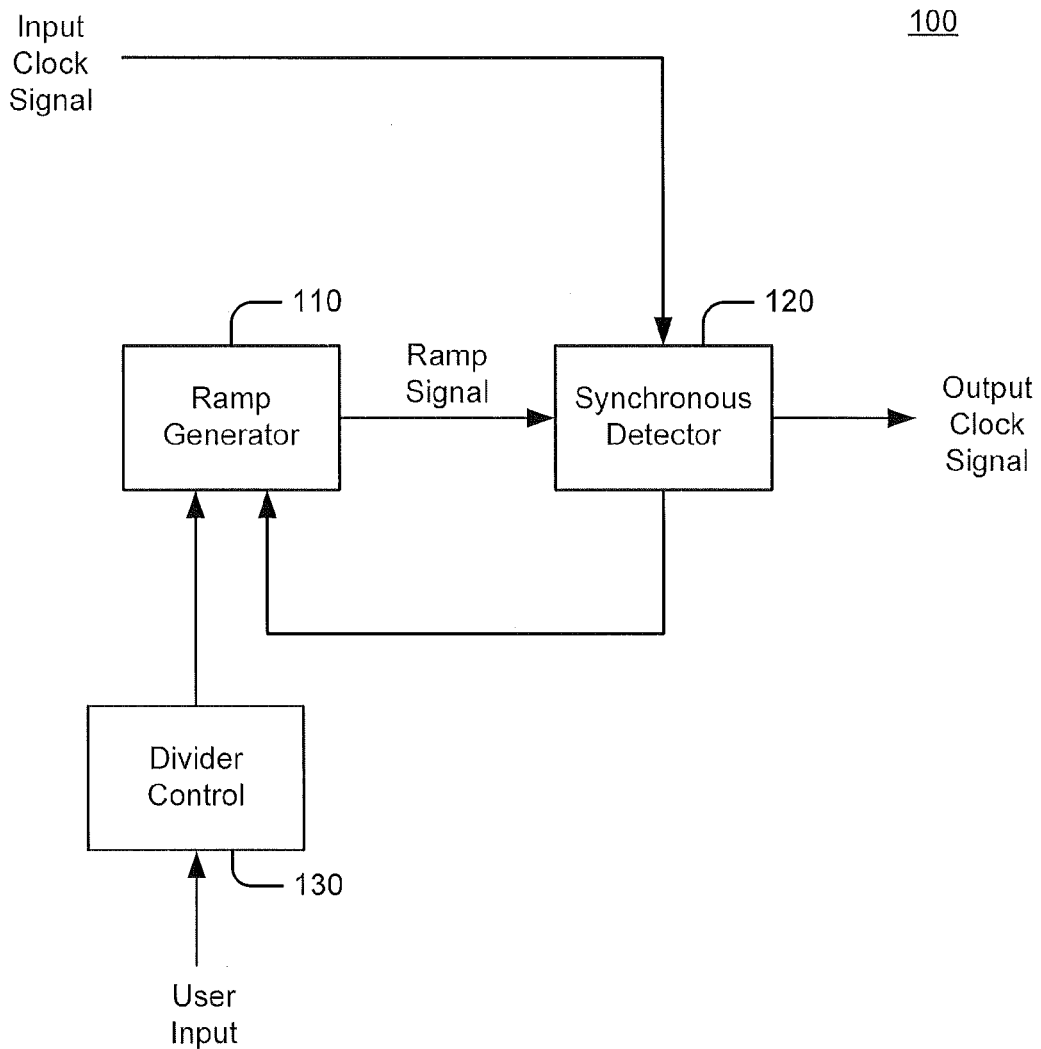
FIG. 1 illustrates a divider circuit according to some embodiments of the inventive subject matter.

Embodiments of the present inventive subject matter now will be described more fully hereinafter with reference to the accompanying drawings, in which embodiments of the inventive subject matter are shown. This inventive subject matter may, however, be embodied in many different forms and should not be construed as limited to the embodiments set forth herein. Rather, these embodiments are provided so that this disclosure will be thorough and complete, and will fully convey the scope of the inventive subject matter to those skilled in the art. Like numbers refer to like items throughout.

It will be understood that, although the terms first, second, etc. may be used herein to describe various items, these items should not be limited by these terms. These terms are only used to distinguish one item from another. For example, a first item could be termed a second item, and, similarly, a second item could be termed a first item, without departing from the scope of the present inventive subject matter. As used herein, the term "and/or" includes any and all combinations of one or more of the associated listed items.

It will be understood that when an item is referred to as being "connected" or "coupled" to another item, it can be directly connected or coupled to the other item or intervening items may be present. In contrast, when an item is referred to as being "directly connected" or "directly coupled" to another item, there are no intervening items present. Throughout the specification, like reference numerals in the drawings denote like items.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

FIG. 1 illustrates a divider circuit 100 according to some embodiments of the inventive subject matter. The divider circuit 100 is configured to generate a reduced-frequency output clock signal from an input clock signal, such as a signal produced by an oscillator. The divider circuit 100 includes a ramp generator circuit 110 configured to produce a ramp signal that changes in magnitude over time. In various embodiments, for example, the ramp signal may be an increasing voltage and/or a decreasing voltage, such as a voltage having a sawtooth or triangle waveform. A synchronous detector circuit 120 is configured to be clocked responsive to the input clock signal and to detect a particular condition of the ramp signal, e.g., when a magnitude of the ramp signal reaches a particular level. The synchronous detector circuit 120 generates a transition in the output clock signal synchronous with an edge of the input clock signal responsive to the detected condition. The divider circuit 100 further includes a divider control circuit 130 that is configured to enable adjustment of the ramp generator circuit 110 responsive to a user input. The divider control circuit 130 may be used, for example, to control the ramp generator circuit 110 to provide a desired division of the input clock signal by varying a rate of the ramp signal generated by the ramp generator circuit 110. As discussed below, the divider control circuit 130 may include a communications circuit, such as an I²C interface circuit, along with circuitry that may be controlled via such a communications circuit to control operation of the ramp generator circuit 110.

In some embodiments, the components of the divider circuit 100, including the ramp generator circuit 110, the synchronous detector circuit 120 and the divider control circuit 130 may be implemented together on a common substrate in an integrated circuit (IC). For example, the divider circuit 100 may be included in an IC, such as a clock generator IC, which may be used, for example, to provide timing signals to other ICs, such as processors and peripherals. The divider circuit 100 may be integrated with a source of the input clock signal in the same IC, or the divider circuit 100 may receive the input clock signal from an external device. Other circuitry, such as additional dividers, buffers, drivers and the like, may also be integrated with such a divider circuit in a single IC.

Figure 2:
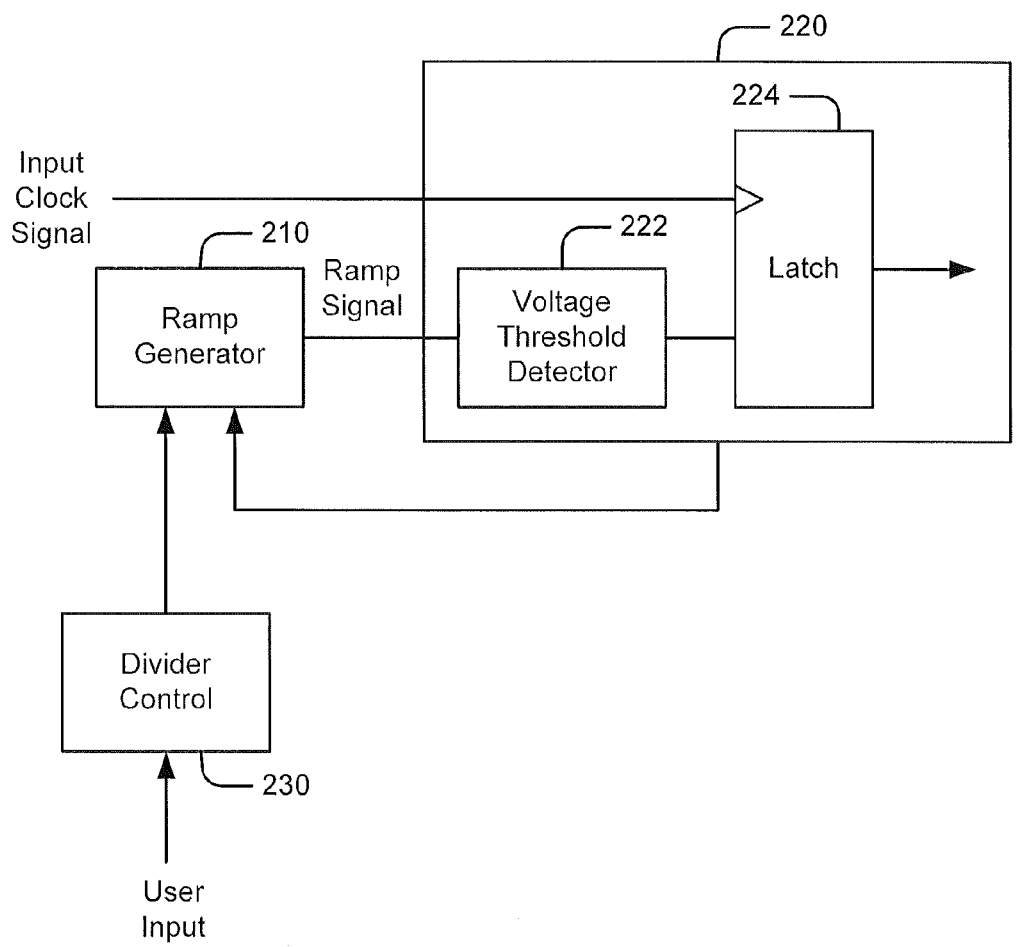
FIG. 2 illustrates a divider circuit including a synchronous detector with a synchronous latch according to some embodiments of the inventive subject matter.

FIG. 2 illustrates an exemplary synchronous detection arrangement according to some embodiments. A divider circuit 200 includes a ramp generator circuit 210, configured to generate a ramp voltage as specified according to a user input to a divider control circuit 240. The ramp voltage is provided to a synchronous detector circuit 220 including a voltage threshold detector circuit 222 and a synchronous latch circuit 224. In particular the voltage threshold detector circuit 222 may detect when the ramp voltage produced by the ramp generator circuit 210 passes through a threshold voltage value, and may responsively generate a change in a data signal that is latched by the synchronous latch circuit 224 responsive to the input clock signal.

The ramp generator circuit 210 may generate a variety of different types of ramp voltages. For example, in embodiments described below, the ramp generator circuit 210 may generate a voltage that ramps up in magnitude and then is reset responsive to the synchronous detector circuit 220 (e.g., the output of the voltage detector circuit 222 or the synchronous latch circuit 224), such that the ramp generator circuit 210 produces a sawtooth wave output. In other embodiments, the ramp generator circuit 210 may provide a triangle wave output with both ramp-up and ramp-down behavior, e.g., the ramp generator circuit 210 may generate a voltage that ramps up for a predetermined time after it reaches a detection threshold of the voltage detector circuit 22, after which the ramp generator circuit 210 produces a gradually decreasing voltage that may be used to provide a second triggering event for the threshold detector circuit 222. As explained below, the use of a sawtooth or triangle wave may effect the duty cycle of the output clock signal produced by the synchronous latch circuit 224. Characteristics of the ramp signal produced by the ramp generator circuit 210 may be controlled responsive to a user input to a divider control circuit 230.

Figure 3:
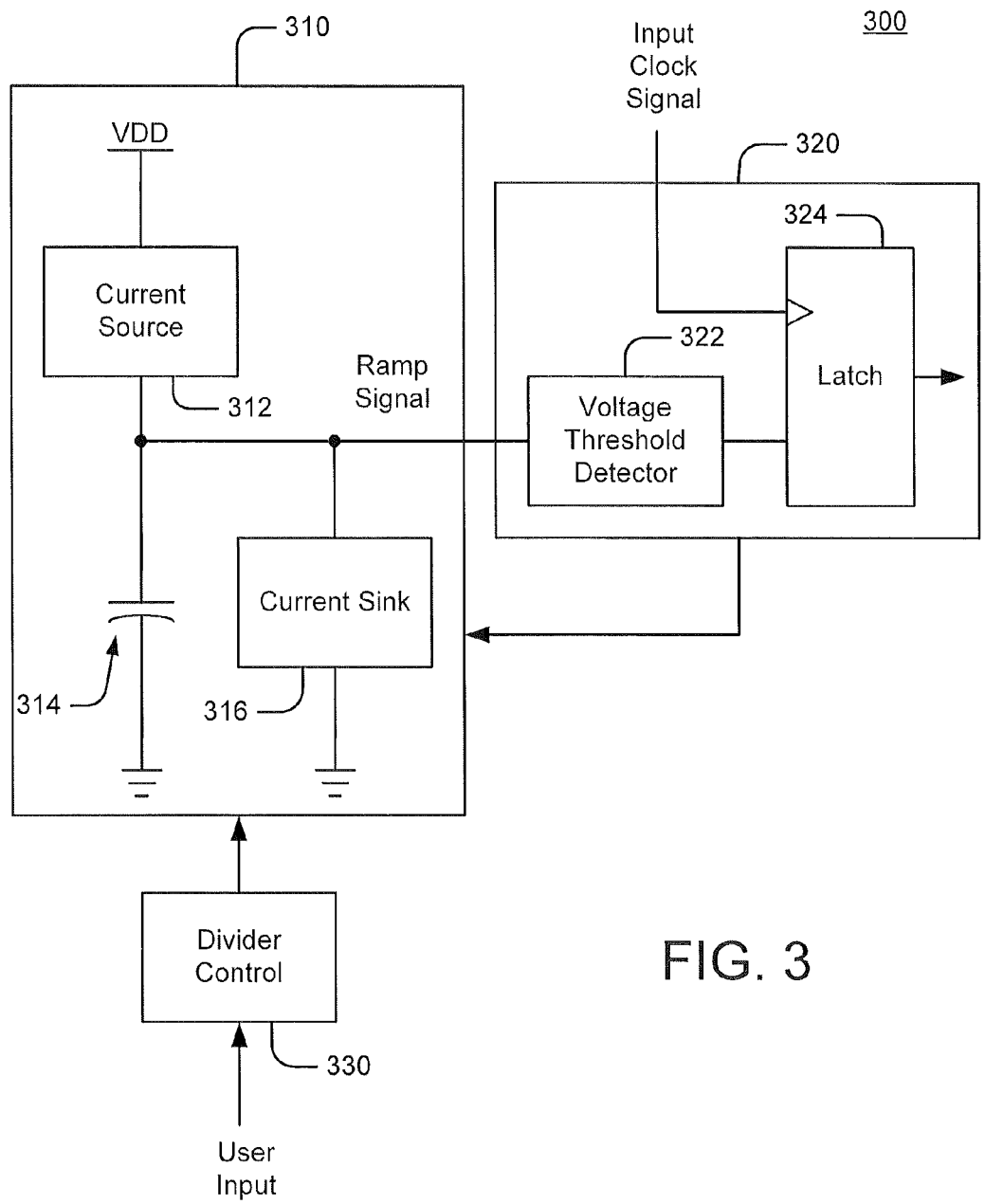
FIG. 3 illustrates a divider circuit with a capacitor-based ramp signal generator according to further some embodiments of the inventive subject matter.

FIG. 3 illustrates an example of an implementation of a divider circuit along the lines of FIG. 2. A divider circuit 300 includes a ramp generator circuit 310, a synchronous detector circuit 320 and a divider control circuit 330. The ramp generator circuit 310 includes a current source circuit 312 that provides a controlled current to charge a capacitance 314, thereby generating a ramp signal that increases in voltage over time. The capacitance 314 may comprise a discrete capacitor and/or may comprise an intrinsic capacitance associated with the ramp signal node.

The ramp generator circuit 310 further includes a current sink circuit 316 which is configured to reduce the ramp voltage by discharging the capacitance 314 to produce, for example, a sawtooth or triangle waveform voltage at the ramp signal node. The synchronous detector circuit 320 includes a voltage threshold detector circuit 322 and a synchronous latch circuit 324, which may operate as discussed above with reference to FIG. 2. The current source circuit 312 and/or the current sink circuit 314 may be configured to operate responsive to the synchronous detector circuit 320 to control timing of transitions of the ramp signal produced by the ramp generator circuit 310.

A divider control circuit 330 may be used to control the current source circuit 312, the capacitor 314 and/or the current sink circuit 316 to thereby control characteristics (e.g., the slope of ramp up or ramp down portions) of the ramp signal produced by the ramp generator circuit 310. For example, the divider control circuit 330 may be used to adjust the current delivered to capacitor 314 by the current source circuit 312. Similarly, the divider control circuit 330 may be used to adjust the rate at which the current sink circuit 316 discharges the capacitor 314. The divider control circuit 330 may include, for example, registers or other memory circuitry that may be used to store values that control bias voltages and/or currents provided to the current source circuit 312 and/or the current sink circuit 316 to control operations thereof. The divider control circuit 330 may also be used to adjust the capacitance of the capacitor 314, e.g., the capacitor 314 may include a bank of switchable capacitors and/or a varactor that may be controlled by the divider control circuit 330 to provide a desired capacitance.

Figure 4:
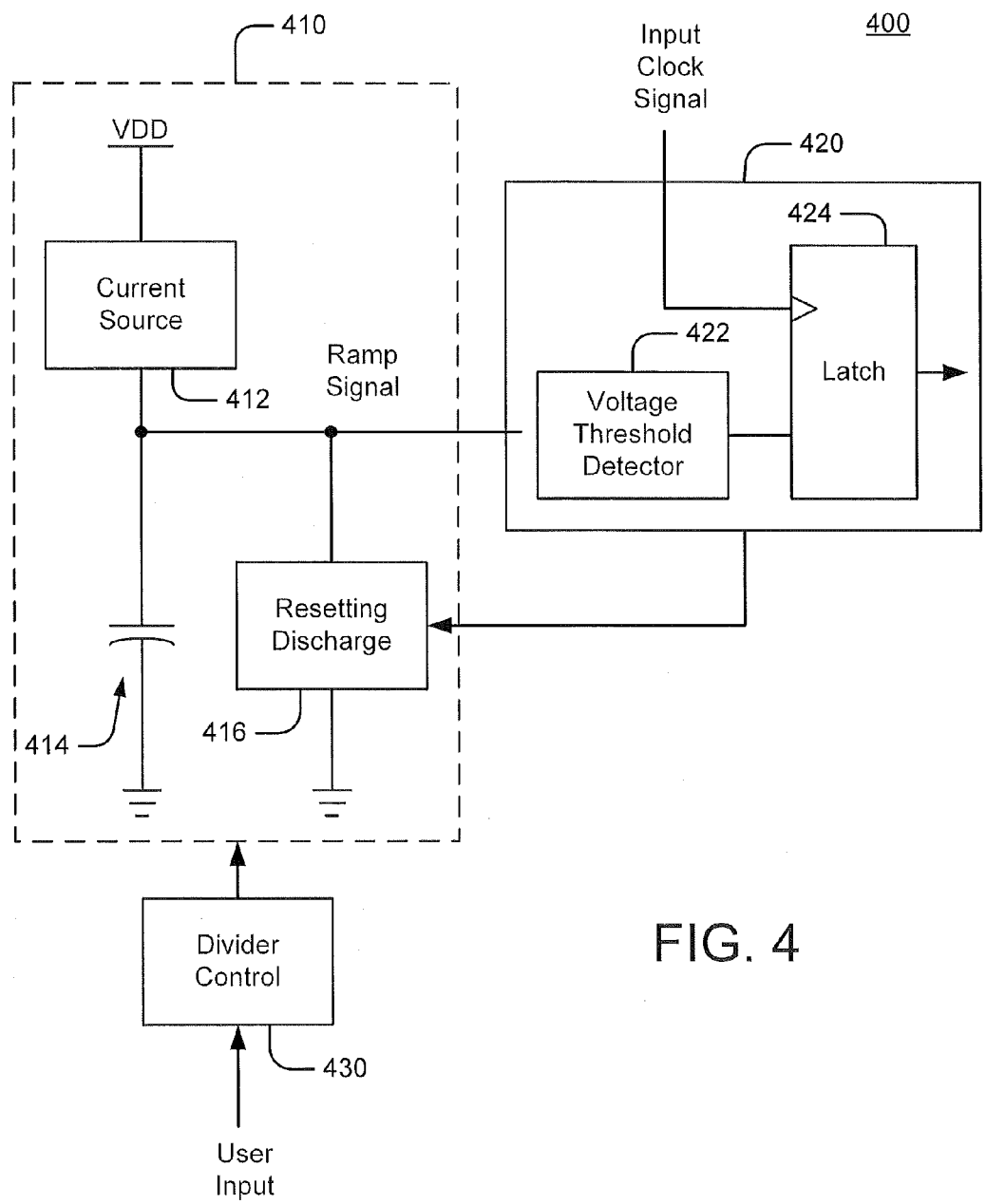
FIG. 4 illustrates a divider circuit including a ramp signal generator with a resetting discharge circuit according to some embodiments of the inventive subject matter.

As noted above, some embodiments may utilize a ramp signal having a sawtooth characteristic. Referring to FIG. 4, a divider circuit 400 may include a ramp generator circuit 410, a synchronous detector circuit 420 and a calibration circuit 430. The ramp generator circuit 410 may include a current source circuit 412, which supplies a charging current to a capacitor 414. The ramp generator circuit 410 further includes a resetting discharge circuit 416 which is configured to rapidly discharge the ramp signal node voltage responsive to the synchronous detector circuit 420, such that the ramp signal has a sawtooth waveform. The synchronous detector circuit 420 includes a voltage threshold detector circuit 422 and a latch circuit 424, which may operate as discussed above with reference to FIG. 3.

Figure 5:
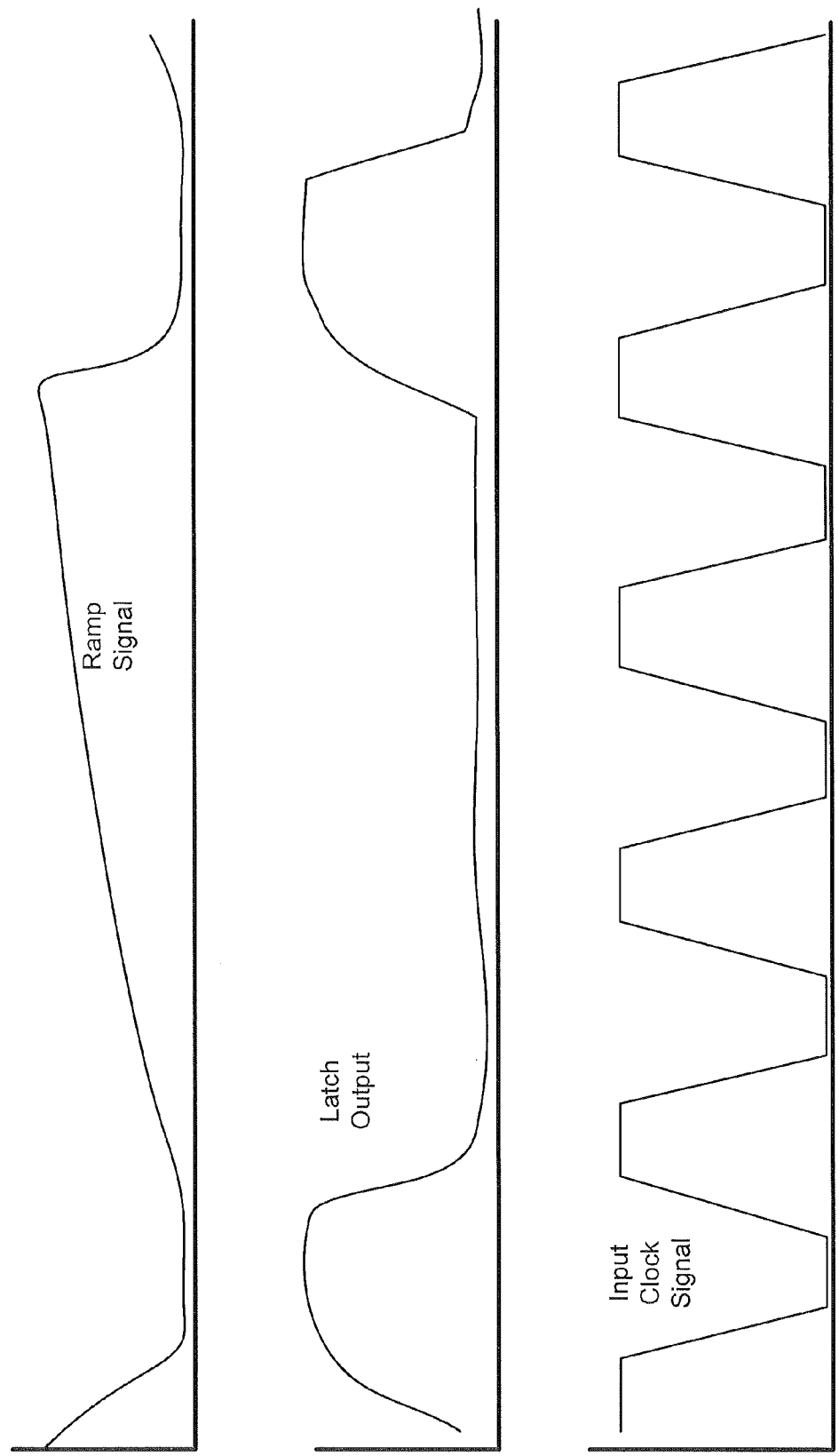
FIG. 5 illustrates operations of the divider circuit of FIG. 4.

FIG. 5 illustrates exemplary operations of the divider circuit 400 of FIG. 4. The ramp signal (voltage) produced by the ramp generator circuit 410 increases in an approximately linear fashion until it reaches a detection threshold of the voltage threshold detector circuit 422. In response to the ramp signal reaching the threshold, the voltage threshold detector circuit 422 generates a transition in its output signal provided to the latch circuit 424, resulting in the low-to-high transition in the latch output signal upon the next rising edge of the input clock signal, as illustrated in FIG. 5. Responsive to the detection signal, the synchronous detector circuit 420 causes the discharge circuit 416 of the ramp generator circuit 410 to discharge the capacitor 414 so that, at a succeeding rising edge of the clock signal, the latch output again goes low. The output of the latch circuit 424 thus provides a clock signal with an asymmetrical duty cycle and a frequency that is a fraction of the input clock signal frequency.

As explained below with reference to FIG. 8, such an asymmetrical duty cycle signal may be passed through an additional divider stage (e.g., a divide by 2 stage) to produce a clock signal with an approximately 50% duty cycle. In other embodiments, however, a ramp down circuit producing a triangle wave ramp signal could be used in combination with an appropriate threshold detector to cause the latch to produce an output clock signal with an approximately 50% duty cycle, thus obviating the need for such a secondary divide by 2 stage. Such a threshold detector circuit may be significantly more complex that that needed for use with a sawtooth ramp signal.

Figure 6:
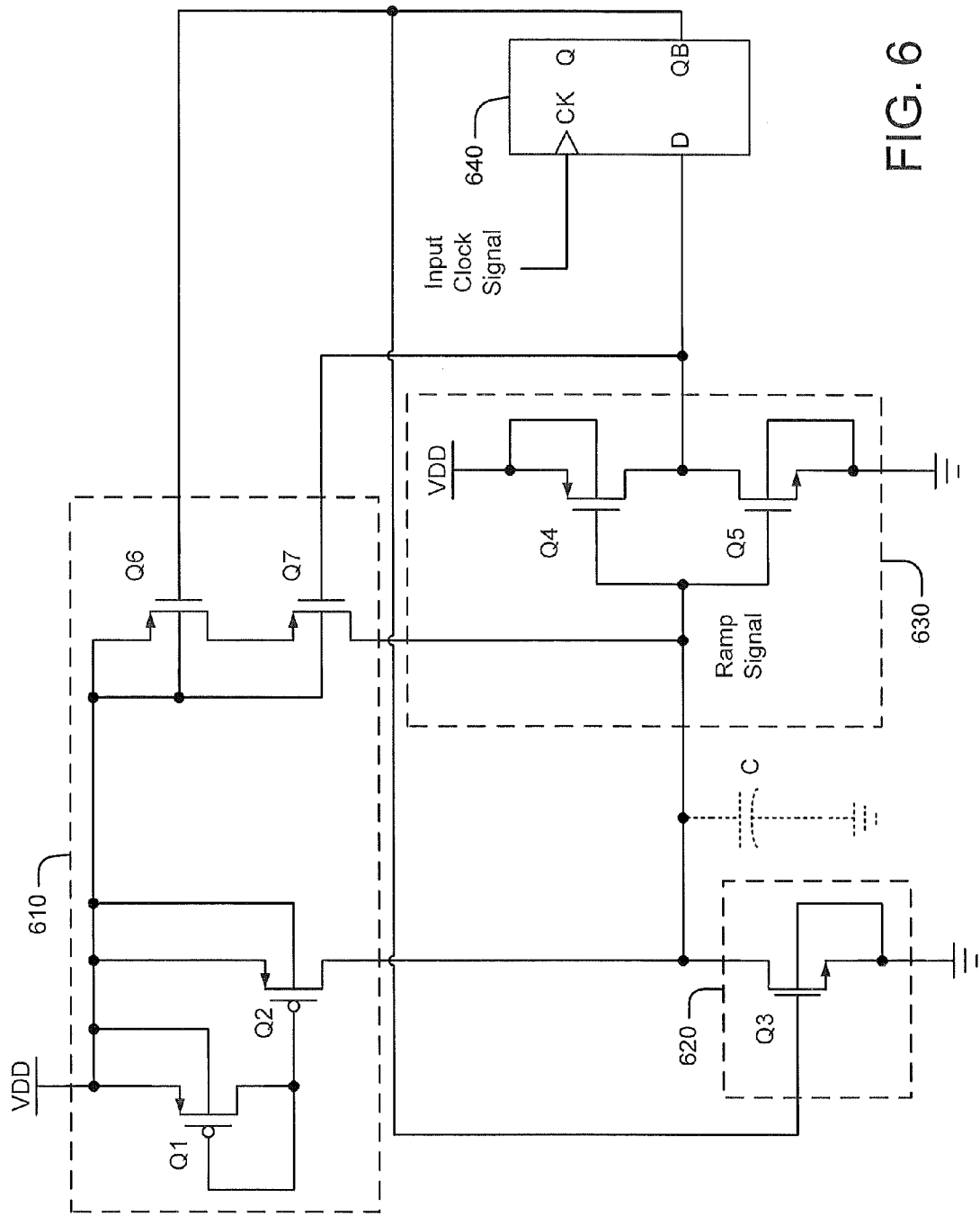
FIG. 6 illustrates a divider circuit according to further embodiments of the inventive subject matter.

FIG. 6 illustrates a device-level implementation of a ramp generator circuit 610, a discharge circuit 620 and a voltage threshold detector circuit 630 according to further embodiments of the inventive subject matter. The ramp generator circuit 610 includes a current source that includes transistors Q1, Q2 and that provides a charging current to an intrinsic capacitance C to generate a ramp signal at the input of the voltage threshold detector circuit 630. The voltage threshold detector circuit 630 includes a CMOS inverter including transistors Q4, Q5. The output of the inverter is provided to a D flip-flop 640, which is clocked by a clock signal. The inverted output of the D flip-flop 640 is provided to the discharge circuit 620, which includes an NMOS transistor Q3 coupled between the ramp signal node and a signal ground. When the inverted output of the D flip-flop goes to a logic "high" in response to the output of the voltage threshold detector and an edge of the clock signal, the discharge circuit discharges the ramp signal node.

Figure 7:
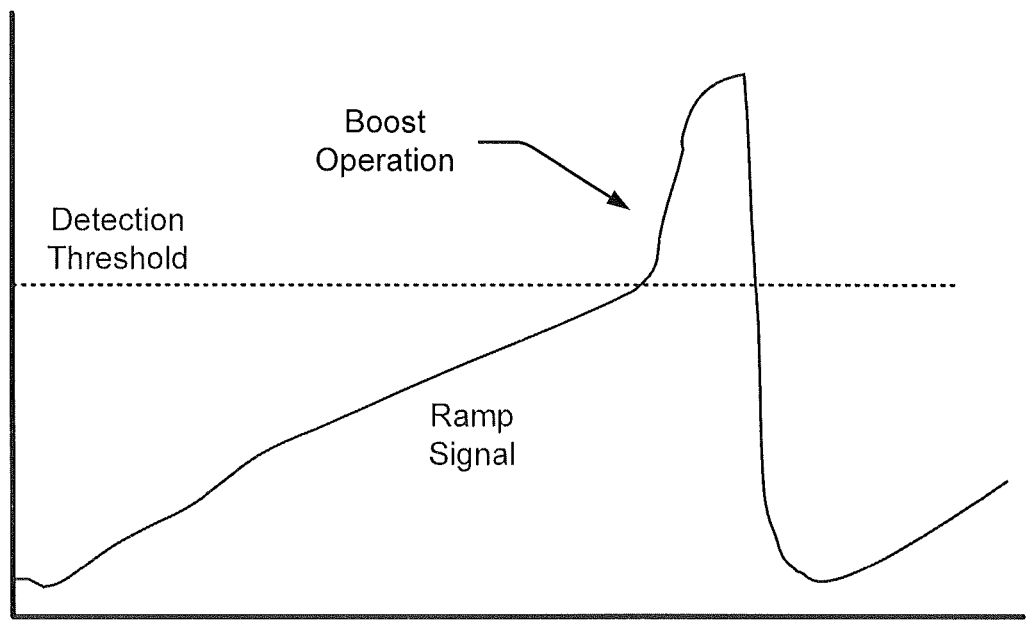
FIG. 7 illustrates operations of a threshold detector circuit of the circuit of FIG. 6.

The inverted output of the D flip-flop 640 is also provided to the ramp generator circuit 610, which also includes a boost circuit including transistors Q6, Q7. The boost circuit is configured to boost the ramp signal when the output of the voltage threshold detector circuit 630 changes in response to the ramp voltage reaching the threshold detector level, as illustrated in FIG. 7. The boost circuit can ensure more affirmative operation of the voltage threshold detector circuit 630 and, thus, improve the stability and repeatability of the divider circuit. As shown, the boost circuit is enabled and disabled based on the state of the output of the D flip-flop 640.

As discussed above, divider circuits according to embodiments of the inventive subject matter can be used in a variety of applications. One such application is illustrated in FIG. 8, which shows a clock generator IC 800. The clock generator IC 800 includes an LC oscillator (LCO) 810, which produces a high-frequency periodic signal. The LCO 810 may take the form, for example, of LCOs described in U.S. Patent Application Publication No. 2010/0271144 to McCorquodale et al. (U.S. patent application Ser. No. 12/766,205, filed Apr. 23, 2010), the disclosure of which is hereby incorporated herein by reference in its entirety. A differential sinusoidal signal produced by the LCO 810 may be provided to a differential-to-single-ended (D/S) converter circuit 820 that produces a corresponding single-ended digital clock signal.

This digital clock signal is provided to a clock input of a D flip-flop 838 of a divider circuit 830. The divider circuit 830 may be configured along the lines discussed above with reference to FIG. 6, and may include a current source circuit 832 that charges an intrinsic capacitance C to produce a ramp signal that is provided to a voltage threshold detecting inverter circuit 836. The output of the inverter circuit 836 is provided to the data input of the D flip-flop 838. The ramp signal node is discharged by a resetting discharge circuit 834 responsive to the inverted output of the D flip-flop 838. The output (inverted and/or non-inverted) of the D flip-flop 838 may be provided to a divide by 2 stage 840 to generate a clock signal with a 50% duty cycle, which may be provide to a driver 850 that is configured to drive a load coupled to an output node 801 of the IC 800. The IC 800 may further include an I²C control circuit 860, which may be used to receive control information for setting up the divider circuit 830, as well as the LCO 810 and other components of the IC 800.

Figure 8:
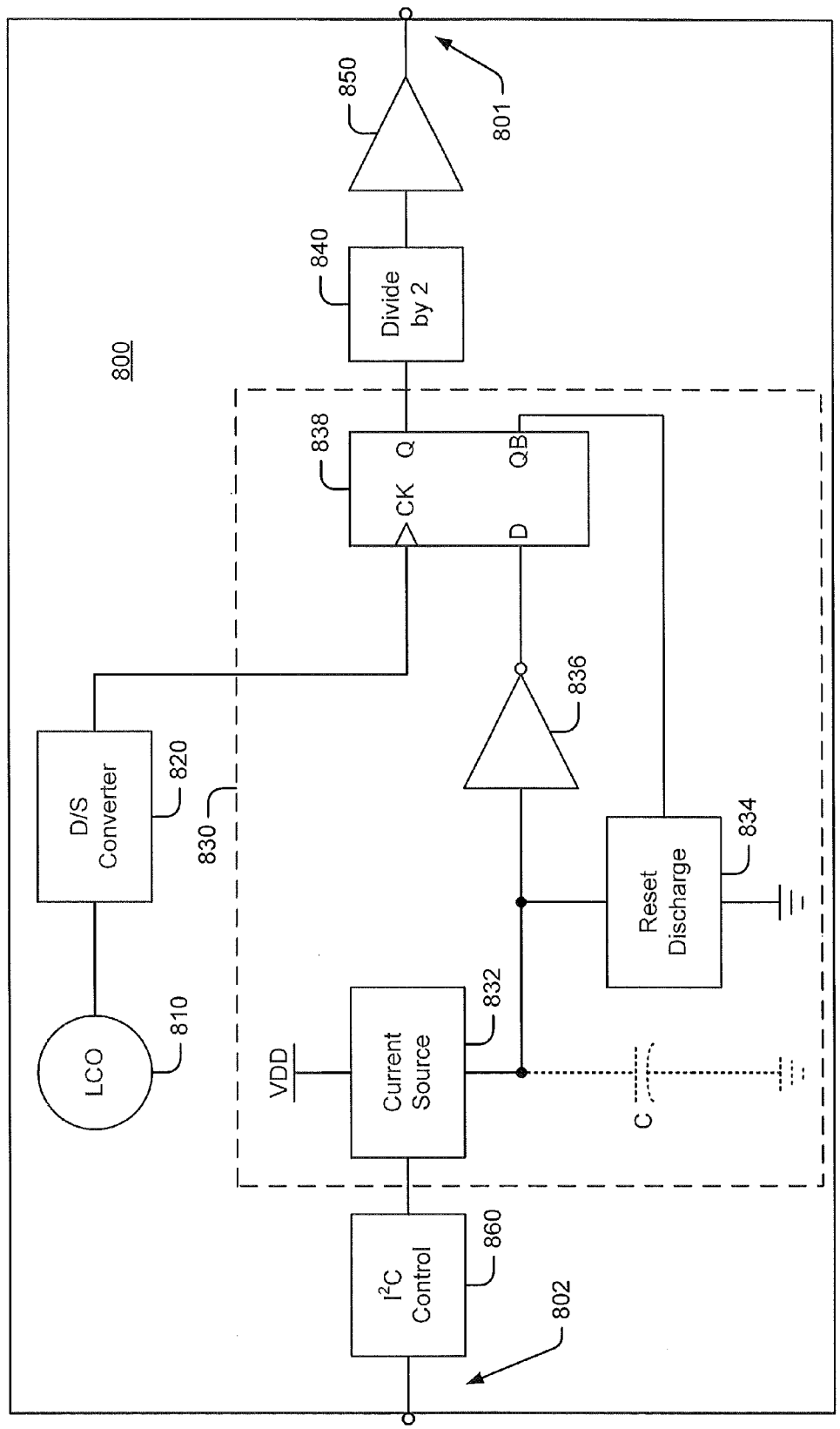
FIG. 8 illustrates a clock generator integrated circuit chip employing a divider circuit according to some embodiments of the inventive subject matter.

It will be appreciated that the embodiments of FIG. 8 are presented for purposes of illustration, and that other IC configurations may be used. For example, in some embodiments, the D flip-flop circuit 838 of the divider circuit 830 could be modified to operate from the sinusoidal signal produced by the LCO 810, obviating the need for the D/S converter circuit 820. In some embodiments, one or more discrete capacitors may be used for ramp generation in the divider circuit 830. The division factor of the divider circuit 830 could be adjusted by varying the capacitance coupled to the ramp signal node, e.g., using a switchable capacitor bank and/or a varactor. Such adjustment could be used in place of or in conjunction with variation of the current source circuit 832. In additional embodiments, the threshold of the inverter circuit 836 could also be adjustable.

In further embodiments, temperature compensation may be provided. For example, in embodiments using a current source and capacitor to generate a ramp signal along the lines described above, the current source and/or the capacitance may be temperature-compensated to provide stable performance over temperature. This could be achieved, for example, by using current source that has a specific temperature response and/or by using a variable capacitance, such as a voltage controlled varactor.

It will be further appreciated that embodiments of the inventive subject matter may be implemented in single-ended and/or differential signal configurations. For example, in some embodiments, a ramp signal generator may be configured to generate a pair of differential signals that simultaneously ramp up and down, respectively, and a threshold detector could sense when the two ramp signals cross as a trigger for clock edge generation. In some embodiments, a flip-flop or other synchronous detector circuit may utilize differential clock signals from an LCO or other oscillator circuit.

In the drawings and specification, there have been disclosed typical embodiments of the inventive subject matter and, although specific terms are employed, they are used in a generic and descriptive sense only and not for purposes of limitation, the scope of the inventive subject matter being set forth in the following claims.

What is claimed is:

1. An integrated circuit chip comprising:
   an LC oscillator (LCO) circuit configured to generate a periodic signal;
   a converter circuit configured to generate a first clock signal from the periodic signal; and
   a divider circuit configured to generate a second clock signal responsive to the first clock signal and comprising a ramp signal generator circuit configured to generate a ramp signal and a synchronous detector circuit configured to receive the ramp signal and the first clock signal and to responsively control the ramp signal generator circuit to generate the second clock signal at an output of the synchronous detector circuit.

2. The integrated circuit chip of claim 1, wherein the synchronous detector circuit comprises:
   a voltage threshold detector circuit configured to receive the ramp signal and to generate a detection signal responsive thereto; and
   a synchronous latch circuit having a clock input configured to receive the input clock signal and a data input configured to receive the detection signal.

3. The integrated circuit chip of claim 2, wherein the synchronous latch circuit is configured to control the ramp generator circuit.

4. The integrated circuit chip of claim 1, wherein the divider circuit comprises:
   a capacitance;
   a current source circuit configured to supply a charging current to the capacitance;
   a threshold detector circuit configured to generate a detection signal responsive to a voltage of the capacitance;
   a flip-flop circuit configured to receive the detection signal at a data input thereof and the first clock signal at a clock input thereof and to responsively generate an output signal; and
   a discharge circuit configured to discharge the capacitance responsive to the flip-flop circuit.

5. The integrated circuit chip of claim 4, wherein the threshold detector circuit comprises an inverter circuit.

6. An integrated circuit chip comprising:
   an oscillator circuit configured to generate a first clock signal; and
   a divider circuit configured to generate a second clock signal responsive to the first clock signal and comprising a ramp signal generator circuit configured to generate a ramp signal and a synchronous detector circuit configured to receive the ramp signal and the first clock signal and to responsively control the ramp signal generator circuit to generate the second clock signal at an output of the synchronous detector circuit, wherein the divider circuit comprises:
   a capacitance;
   a current source circuit configured to supply a charging current to the capacitance;
   an inverter configured to generate a detection signal responsive to a voltage of the capacitance;
   a flip-flop circuit configured to receive the detection signal at a data input thereof and the first clock signal at a clock input thereof and to responsively generate an output signal;
   a discharge circuit configured to discharge the capacitance responsive to the flip-flop circuit; and
   a boost circuit coupled to an input of the inverter circuit and configured to boost a voltage at the input of the inverter circuit in response to a state transition of an output of the inverter.

7. The integrated circuit chip of claim 4, further comprising a control circuit configured to adjust the current source circuit and/or the capacitance.

* * * * *